United States Patent
Tanabe

(10) Patent No.: US 10,854,799 B2
(45) Date of Patent: Dec. 1, 2020

(54) DISPLAY DEVICE

(71) Applicant: Funai Electric Co., Ltd., Osaka (JP)

(72) Inventor: Noritaka Tanabe, Osaka (JP)

(73) Assignee: FUNAI ELECTRIC CO., LTD., Osaka (JP)

(*) Notice: Subject to any disclaimer, the term of this patent is extended or adjusted under 35 U.S.C. 154(b) by 0 days.

(21) Appl. No.: 16/240,079

(22) Filed: Jan. 4, 2019

(65) Prior Publication Data

US 2019/0140153 A1 May 9, 2019

Related U.S. Application Data

(63) Continuation of application No. 15/793,088, filed on Oct. 25, 2017, now Pat. No. 10,522,726.

(30) Foreign Application Priority Data

Oct. 27, 2016 (JP) ................ 2016-210490

(51) Int. Cl.
*H01L 33/60* (2010.01)
*G02F 1/13357* (2006.01)
(Continued)

(52) U.S. Cl.
CPC ............ *H01L 33/60* (2013.01); *G02B 6/0045* (2013.01); *G02F 1/133553* (2013.01); *G02F 1/133603* (2013.01); *G02F 1/133605* (2013.01); *H01L 33/46* (2013.01); *H01L 33/54* (2013.01); *H05B 33/04* (2013.01); *H05B 33/10* (2013.01);
(Continued)

(58) Field of Classification Search
CPC ......... H01L 33/60; H01L 33/46; H01L 33/54; H01L 33/22; H01L 33/508; H01L 25/0753; H01L 33/48; H01L 33/50; H01L 33/56; H01L 33/05; G02B 6/0045; G02F 1/133553; G02F 1/133603; G02F 1/133605; H05B 33/04; H05B 33/10
See application file for complete search history.

(56) References Cited

U.S. PATENT DOCUMENTS

2005/0167682 A1  8/2005  Fukasawa
2007/0086211 A1  4/2007  Beeson et al.
(Continued)

FOREIGN PATENT DOCUMENTS

EP    2808911 A2    12/2014
JP    2001-257381 A  9/2001
(Continued)

OTHER PUBLICATIONS

Extended European Search Report of the corresponding European Application No. 17198757.1, dated Feb. 19, 2018.
(Continued)

*Primary Examiner* — Sonji N Johnson
(74) *Attorney, Agent, or Firm* — Global IP Counselors, LLP

(57) ABSTRACT

A display device includes a display, at least one light source, and a light source disposition component. The display displays image. The at least one light source emits light to the display. The at least one light source is disposed on the light source disposition component, with the light source disposition component having a trapezoidal cross-sectional shape.

14 Claims, 7 Drawing Sheets

(51) Int. Cl.
*F21V 8/00* (2006.01)
*G02F 1/1335* (2006.01)
*H01L 33/54* (2010.01)
*H05B 33/04* (2006.01)
*H05B 33/10* (2006.01)
*H01L 33/46* (2010.01)
H01L 25/075 (2006.01)
H01L 33/22 (2010.01)
H01L 33/50 (2010.01)

(52) U.S. Cl.
CPC .......... *H01L 25/0753* (2013.01); *H01L 33/22* (2013.01); *H01L 33/508* (2013.01)

(56) References Cited

U.S. PATENT DOCUMENTS

| | | |
|---|---|---|
| 2012/0013811 A1 | 1/2012 | Shimizu |
| 2012/0113621 A1 | 5/2012 | Lee et al. |
| 2013/0278865 A1 | 10/2013 | He |
| 2015/0029710 A1 | 1/2015 | Kim et al. |
| 2015/0049510 A1 | 2/2015 | Haiberger et al. |

FOREIGN PATENT DOCUMENTS

| | | | | |
|---|---|---|---|---|
| JP | 2006-319371 A | 11/2006 | | |
| WO | 2007/141763 A1 | 12/2007 | | |
| WO | 2013/038802 A1 | 3/2013 | | |
| WO | WO-2013038802 A1 * | 3/2013 | ....... | G02F 1/133603 |

OTHER PUBLICATIONS

The European search report for the corresponding European application No. 19151492.6, dated Apr. 5, 2019.

* cited by examiner

FIRST EMBODIMENT

FIRST EMBODIMENT

SECOND EMBODIMENT

SECOND EMBODIMENT

THIRD EMBODIMENT

FOURTH EMBODIMENT

FOURTH EMBODIMENT

MODIFICATION EXAMPLE
OF FIRST EMBODIMENT

DISPLAY DEVICE

CROSS-REFERENCE TO RELATED APPLICATIONS

This is a continuation application of U.S. patent application Ser. No. 15/793,088 filed on Oct. 25, 2017, which claims priority to Japanese Patent Application No. 2016-210490 filed on Oct. 27, 2016. The entire disclosures of U.S. patent application Ser. No. 15/793,088 and Japanese Patent Application No. 2016-210490 are hereby incorporated herein by reference.

BACKGROUND

Field of the Invention

The present invention generally relates to a display device. More specifically, the present invention relates to a display device having a light source with a reflective layer.

Background Information

Conventionally, a display device includes a light source. Japanese Patent Application Publication No. 2006-319371 (Patent Literature 1) discloses a light emitting element with a reflective layer.

Specifically, the reflective layer disclosed in Patent Literature 1 reflects light and is formed between layers of a semiconductor element (LED chip), or on a surface of a sapphire substrate of the semiconductor element.

SUMMARY

With the light emitting element disclosed in Patent Literature 1, the reflective layer is formed between the layers of the semiconductor element (LED chip) or on the surface of the sapphire substrate of the semiconductor element. Thus, it is difficult to make the surface area of the reflective layer larger than the surface area of the semiconductor element in a plan view. Accordingly, of the light emitted from the semiconductor element, the proportion of the light that is transmitted above the semiconductor element without being reflected by the reflective layer becomes larger. As a result, the proportion of the light emitted to the side of the light emitting element relative to the light emitted above the light emitting element becomes smaller, which decreases a light distribution angle from the light emitting element.

One object of the present invention is to provide a display device with which a decrease in the light distribution angle can be suppressed.

In view of the state of the known technology and in accordance with an aspect of the present invention, a display device includes a display, at least one light source, and a light source disposition component. The display displays image. The at least one light source emits light to the display. The at least one light source is disposed on the light source disposition component, with the light source disposition component having a trapezoidal cross-sectional shape.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

First, the configuration of a display device 10 pertaining to the first embodiment will now be described through reference to FIGS. 1 to 4.

Overall Configuration of Display Device

Figure 1:
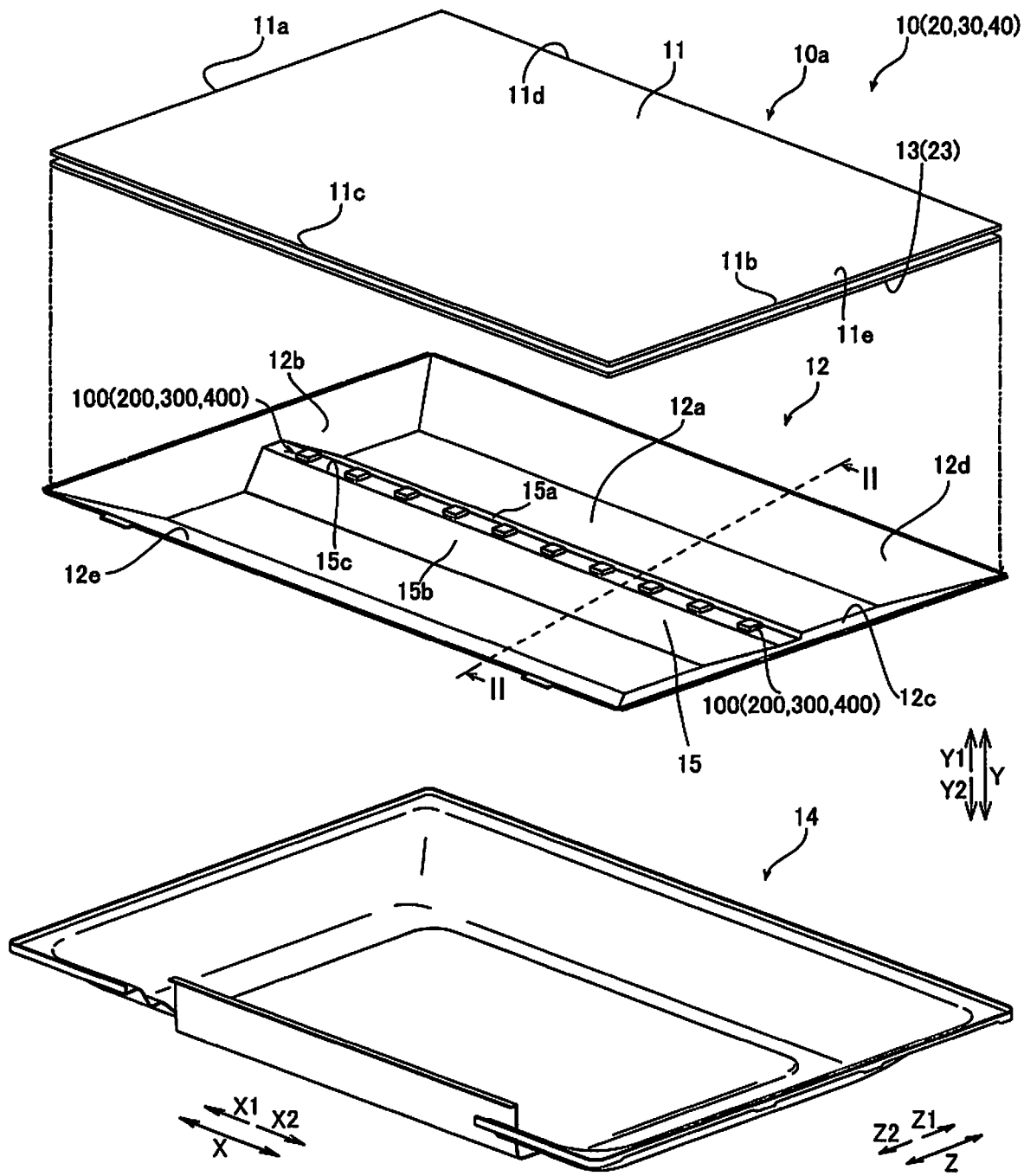
FIG. 1 is an exploded perspective view of a display device pertaining to first to fourth embodiments.

As shown in FIG. 1, a display device main body 10a is provided to the display device 10 pertaining to the first embodiment. The display device main body 10a includes a display component 11 (e.g., display) for displaying images, a reflective sheet 12, an optical sheet 13, and a rear frame 14, which will all be described below. The display component 11 includes a liquid crystal cell, for example. The display component is configured to display image. In the following description, when viewed from a position facing the display component 11 of the display device 10 (i.e., an elevational view), the left direction is the arrow X1 direction, the right direction is the arrow X2 direction, the front direction (toward the viewer) is the arrow Y1 direction, the rear direction is the arrow Y2 direction, the upward direction is the arrow Z1 direction, and the downward direction is the arrow Z2 direction. Also, in the illustrated embodiment, as shown in FIG. 1, X direction represents the horizontal direction of the display device 10, Y direction represents front-to-rear direction of the display device 10, and Z direction represents the vertical direction of the display device 10.

Also, the display device 10 includes an LED element 100 that emits light to the display component 11. The display device 10 is configured as a direct-type liquid crystal module that displays video on the display component 11, using as a backlight the LED (light emitting diode) element 100 provided on the arrow Y2 direction side. The LED element 100 is an example of the "at least one light source" of the present disclosure.

Configuration of Components of Display Device

As shown in FIG. 1, the display component 11 is in the form of a plate arranged on a plane parallel to the XZ plane. The display component 11 is configured to have a rectangular shape including short sides 11a and 11b (short edges) and long sides 11c and 11d (long edges). Also, the display component 11 includes a display face 11e bounded by the short side 11a, the short side 11b, the long side 11c, and the long side 11d.

Figure 3:
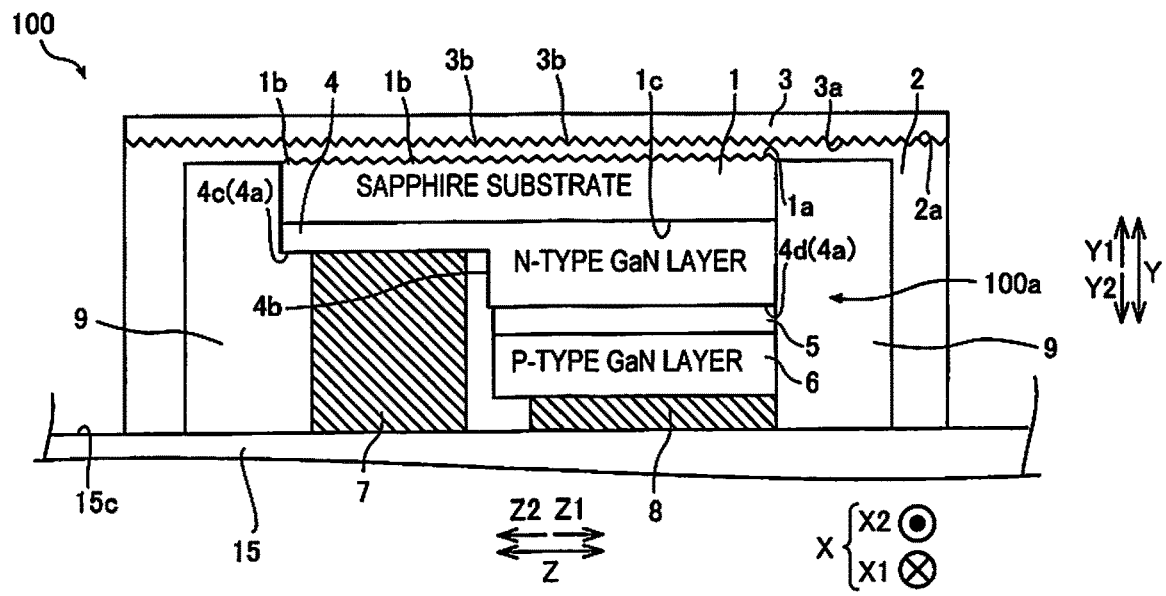
FIG. 3 is a cross sectional view of a light source of the display device pertaining to the first embodiment.

The LED element 100 includes an LED chip 100a (see FIG. 3). A plurality (ten, for example) of the LED elements 100 are provided, and they are configured to emit light on the side of the display component 11 (the arrow Y1 direction side). The LED chip 100a is an example of the "semiconductor element" of the present disclosure.

The reflective sheet 12 includes a bottom face 12a that is arranged substantially parallel to the display face 11e of the display component 11. The display face 11e of the display component 11 is disposed substantially parallel to the optical sheet 13. Also, the reflective sheet 12 includes inclined parts 12b to 12e. The inclined parts 12b to 12e are inclined to the bottom face 12a and are provided between the bottom face 12a and the outer edges (the short sides 11a and 11b and the long sides 11c and 11d) of the display component 11. The inclined parts 12b to 12e is configured to reflect (and diffuse) light from the LED element 100. Also, the reflective sheet 12 is provided between the rear frame 14 and the optical sheet 13. The reflective sheet 12 is configured to reflect the light from the LED element 100 to the side of the display component 11 (the arrow Y1 direction side). The rear frame 14 is made of metal, for example. The rear frame 14 is formed in a concave shape recessed in the arrow Y2 direction. Also, the rear frame 14 is attached to the display device 10 from the arrow Y2 direction side.

More specifically, the reflective sheet 12 is made of a resin (preferably PET (polyethylene terephthalate) in a reflective state), for example. The reflecting sheet 12 is configured to have a shape that conforms to the rear frame 14 (a concave shape recessed toward the arrow Y2 direction side).

The bottom face 12a of the reflective sheet 12 is formed to have a rectangular shape on a plane parallel to the XZ plane.

The inclined parts 12b to 12e of the reflective sheet 12 extends from the edges of the bottom face 12a, respectively, to surround the bottom face 12a. The inclined part 12b is provided between the end of the bottom face 12a on the arrow X1 direction side and the short side 11a of the display component 11, and is inclined with respect to the bottom face 12a. Like the inclined part 12b, the inclined part 12c (12d and 12e) is provided between the end of the bottom face 12a and the short side 11b (the long side 11c and the long side 11d) of the display component 11, and is inclined with respect to the bottom face 12a.

Figure 2:
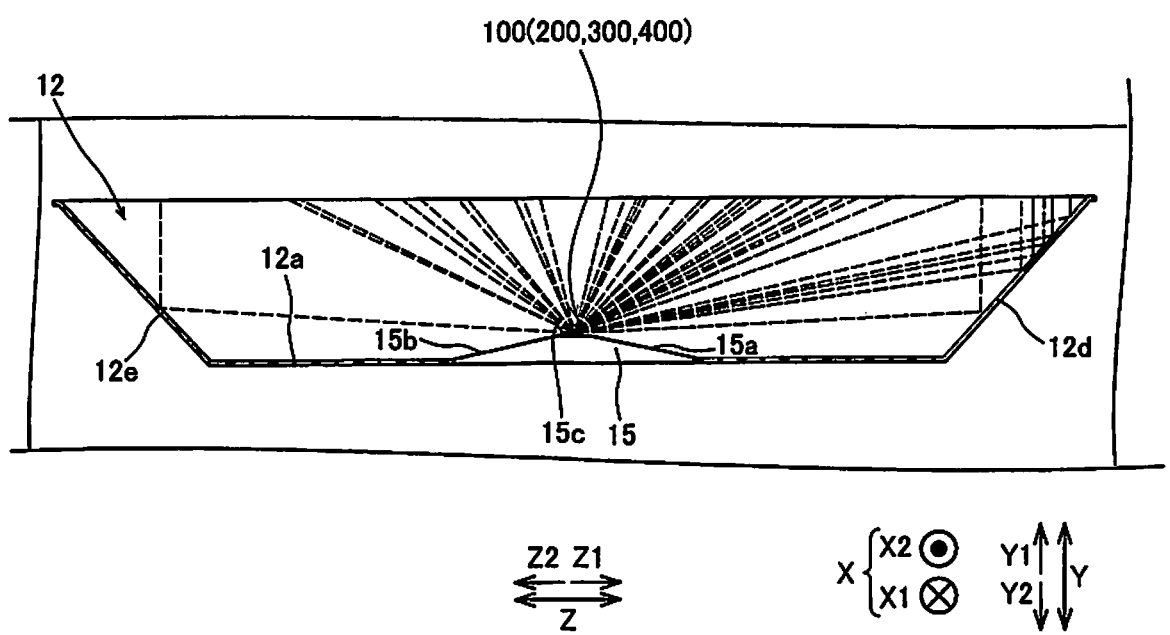
FIG. 2 is a cross sectional view of the display device, taken along line in FIG. 1.

Here, in the first embodiment, as shown in FIGS. 1 and 2, the LED element 100 is disposed closer to the display component 11 than the bottom face 12a in a direction (Y direction) substantially perpendicular to the display face 11e of the display component 11. More specifically, the display device 10 is provided with a light source disposition component 15 that protrudes from the bottom face 12a toward the display component 11 (Y1 direction side).

The light source disposition component 15 includes an inclined part 15a provided so as to be opposite the inclined part 12d, and an inclined part 15b provided so as to be opposite the inclined part 12e. The light source disposition component 15 includes a flat part 15c that connects the end of the inclined part 15a on the Y1 direction side with the end of the inclined part 15b on the Y1 direction side. The flat part 15c is provided so as to extend in the X direction. Ten LED elements 100 are mounted on the flat part 15c, spaced apart in the X direction. Although not depicted, a heat sink and a wiring board for the light source are provided between the flat part 15c and the LED elements 100. The light source disposition component 15 can be covered by the reflective sheet 12.

As shown in FIG. 2, the cross-sectional shape of the light source disposition component 15 is trapezoidal. The LED elements 100 disposed on the flat part 15c emit light radially. In FIG. 2, members other than the reflective sheet 12, the light source disposition component 15, and the LED element 100 are omitted for the sake of brevity. The broken lines in FIG. 2 are examples of the paths of light emitted from the LED element 100.

In the illustrated embodiment, the optical sheet 13 includes a diffusion plate, a polarizing film, or the like. As shown in FIG. 1, the optical sheet 13 is formed in a flat shape extending in a plane parallel to the XZ plane between the display component 11 and the rear frame 14. Consequently, the light emitted from the LED elements 100 irradiates the optical sheet 13. As a result, the light emitted from the LED elements 100 is diffused by the optical sheet 13, and the polarization directions of the light are aligned by the optical sheet 13. The optical sheet 13 is not limited to being configured as a single sheet, and can be a combination of a plurality of sheets each having a specific function.

The display component 11 is configured to display images by changing the transmissivity of the liquid crystal with respect to the light transmitted through the optical sheet 13, or the like.

Configuration of LED Element

Here, in the first embodiment, as shown in FIG. 3, the LED element 100 includes the LED chip 100a including the sapphire substrate 1. The LED element 100 also includes a translucent sealing resin 2 that covers the LED chip 100a. The upper face 2a of the sealing resin 2 is formed substantially flat. The LED element 100 includes a reflective layer 3 disposed on the upper face 2a of the sealing resin 2. Thus, the reflective layer 3 forms an uppermost layer of the LED element 100. Specifically, an upper face of the reflective layer 3 forms an uppermost face of the LED element 100. More specifically, the upper face 2a of the sealing resin 2 is formed to be substantially parallel to the flat part 15c of the light source disposition component 15. The sapphire substrate 1 and the upper face 2a are examples of the "substrate" and the "upper face of the sealing resin," respectively, of the present disclosure. The phrase "the upper face 2a is formed substantially flat" is a broad concept encompassing a case in which fine bumps or pits are formed on the upper face 2a of the sealing resin 2.

Of the light emitted from the LED chip 100a (a PN junction 5 (discussed below)), the light emitted toward the upper side of the LED chip 100a is incident on the reflective layer 3, and is reflected to the sides of the LED chip 100a, or to the lower side of the reflective layer 3.

Also, the lower face 3a of the reflective layer 3 has an uneven shape. More specifically, a plurality of tiny protrusions 3b are disposed on the lower face 3a of the reflective layer 3. The protrusions 3b protrude so as to taper toward the arrow Y2 direction side. The lower face 3a is an example of the "lower face of the reflective layer" of the present disclosure.

The upper face 1a of the sapphire substrate 1 also has an uneven shape. More specifically, a plurality of tiny protrusions 1b are disposed on the upper face 1a of the sapphire substrate 1. In other words, the upper face 1a of the sapphire substrate 1 is formed as an uneven upper face. The protrusions 1b protrude toward the arrow Y1 direction side. The protrusions 1b are formed by electric discharge machining. The upper face 1a is an example of the "upper face of the substrate" of the present disclosure.

The reflective layer 3 is made of gold. More specifically, the reflective layer 3 is provided by vapor-depositing gold on the upper face 2a of the sealing resin 2.

Also, in the first embodiment, the reflective layer 3 is formed substantially flat. More specifically, the reflective layer 3 is configured so that its thickness in the Y direction is substantially constant. The phrase "the reflective layer 3 is formed substantially flat" is a broad concept encompassing a case in which fine bumps or pits are formed on the lower face 3a of the reflective layer 3.

In the first embodiment, the LED chip 100a includes the sapphire substrate 1, an N-type GaN layer 4, the PN junction 5, and a P-type GaN layer 6 that are disposed in this order starting from the upper face 2a side of the sealing resin 2 (the arrow Y1 direction side). That is, in the LED chip 100a, the sapphire substrate 1 is disposed on the uppermost face. In other words, the sapphire substrate 1 is disposed at a top of the LED chip 100a. That is, the LED chip 100a is a flip chip type. More specifically, the N-type GaN layer 4 is formed under the lower face 1c of the sapphire substrate 1. Also, a stepped part 4b extending in the Y direction (as viewed from the X direction) is provided to the lower face 4a of the N-type GaN layer 4. A flat face 4c and a flat face 4d are provided to the lower face 4a of the N-type GaN layer 4, with the stepped part 4b as a boundary. The flat face 4c is substantially flat and parallel relative to the XZ plane, and extends in the Z2 direction relative to the stepped part 4b. The flat face 4d is substantially flat and parallel relative to the XZ plane, and extends in the Z1 direction relative to the stepped part 4b. The PN junction 5 is formed under the flat face 4d of the N-type GaN layer 4. A negative electrode pad 7 is provided under the flat face 4c of the N-type GaN layer 4. The P-type GaN layer 6 is formed under the PN junction 5. A positive electrode pad 8 is provided under the P-type GaN layer 6. Also, the positive electrode pad 8 and the negative electrode pad 7 are in contact with (soldered to) and electrically connected to a copper foil (not shown) on the flat part 15c of the light source disposition component 15. The PN junction 5 is an example of the "light emitting layer" of the present disclosure. The N-type GaN layer 4 and the P-type GaN layer 6 are examples of the "first conductivity type GaN layer" and the "second conductivity type GaN layer," respectively, of the present disclosure.

Figure 4:
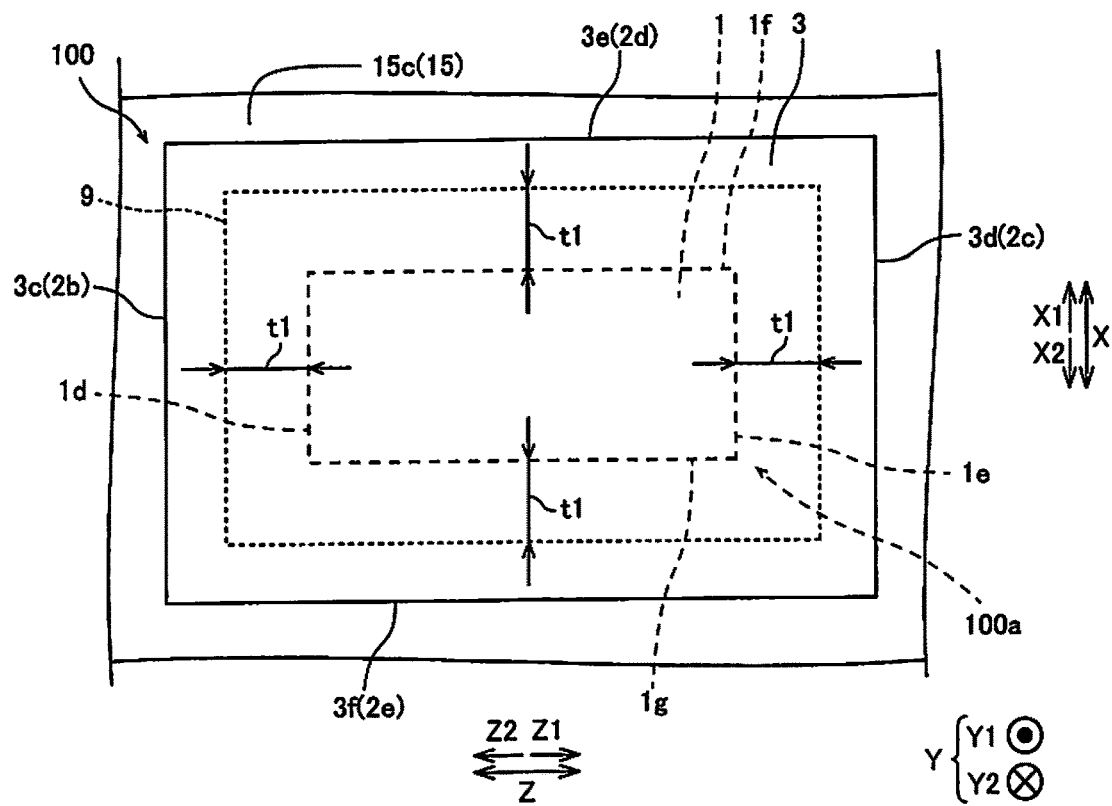
FIG. 4 is a top plan view of the light source pertaining to the first embodiment.

Also, in the first embodiment, as shown in FIG. 4, the reflective layer 3 has an outer periphery that is disposed further to the outside than an outer periphery of the LED chip 100a as viewed in a direction perpendicular to an upper face of the LED element 100 or in the Y direction (hereinafter "in the plan view"). More specifically, in the plan view, the reflective layer 3 is configured to have a rectangular shape that includes the short sides 3c (the arrow Z2 direction side) and 3d (the arrow Z1 direction side), and the long sides 3e (the arrow X1 direction side) and 3f (the arrow X2 direction side). In the plan view, the sapphire substrate 1 is configured to have a rectangular shape that includes the short sides 1d (the arrow Z2 direction side) and 1e (the arrow Z1 direction side), and the long sides 1f (the arrow X1 direction side) and 1g (the arrow X2 direction side). The short side 3c of the reflective layer 3 is provided more on the arrow Z2 direction side than the short side 1d of the sapphire substrate 1, and the short side 3d of the reflective layer 3 is provided more on the arrow Z1 direction side than short side 1e of the sapphire substrate 1. The long side 3e of the reflective layer 3 is provided more on the arrow X1 direction side than the long side 1f of the sapphire substrate 1, and the long side 3f of the reflective layer 3 is provided more on the arrow X2 direction side than the long side 1g of the sapphire substrate 1. The short side 3c, the short side 3d, the long side 3e, and the long side 3f are examples of "the outer periphery of the reflective layer." The short side 1d, the short side 1e, the long side 1f, and the long side 1g are examples of "the outer periphery of the semiconductor element."

In the plan view, the outer periphery of the reflective layer 3 is configured to substantially overlap the outer periphery of the sealing resin 2 (see FIG. 3). More specifically, in the plan view, the sealing resin 2 is configured to have a rectangular shape that includes has the short sides 2b (the arrow Z2 direction side) and 2c (the arrow Z1 direction side), and the long sides 2d (the arrow X1 direction side) and 2e (the arrow X2 direction side). Also, in the plan view, the short side 3c of the reflective layer 3 and the short side 2b of the sealing resin 2 substantially overlap. Also, in the plan view, the short side 3d of the reflective layer 3 and the short side 2c of the sealing resin 2 substantially overlap. Also, in the plan view, the long side 3e of the reflective layer 3 and the long side 2d of the sealing resin 2 substantially overlap. Also, in the plan view, the long side 3f of the reflective layer 3 and the long side 2e of the sealing resin 2 substantially overlap.

In the first embodiment, as shown in FIG. 3, the upper face 1a of the sapphire substrate 1 and the lower face 3a of the reflective layer 3 are configured to be separated from each other by the sealing resin 2. More specifically, the entire upper face 1a of the sapphire substrate 1 is covered by the sealing resin 2. Thus, the sapphire substrate 1 (the upper face 1a) does not directly contact with the reflective layer 3 (the lower face 3a).

Also, in the first embodiment, the LED element 100 further includes a phosphor layer 9 that is disposed between the sealing resin 2 and the LED chip 100a. The phosphor layer 9 is disposed on the side faces of the LED chip 100a. Also, the phosphor layer 9 is disposed so as to overlap the reflective layer 3 in the plan view. The sealing resin 2 and the upper face 1a of the LED chip 100a (the sapphire substrate 1) closely contact with each other. More specifically, the phosphor layer 9 is disposed so as to cover the entire surface of the LED chip 100a other than the upper face 1a of the sapphire substrate 1. Also, the entire phosphor layer 9 is disposed inside the sealing resin 2. Specifically, the sealing resin 2 entirely covers the LED chip 100a and the phosphor layer 9.

In the first embodiment, as shown in FIG. 4, the phosphor layer 9 is arranged to surround the side faces of the LED chip 100a. More specifically, in the plan view, the phosphor layer 9 with a thickness t1 is disposed to closely contact with the short side 1d, the short side 1e, the long side 1f, and the long side 1g of the LED chip 100a (the sapphire substrate 1).

Effect of First Embodiment

The following effects can be obtained with the first embodiment.

As described above, in the first embodiment, the display device 10 comprises the display component 11 for displaying images and the LED elements 100 for emitting light at the display component 11. The LED elements 100 each include an LED chip 100*a*. The LED chip 100*a* includes the sapphire substrate 1, the translucent sealing resin 2 that covers the LED chip 100*a*, and the reflective layer 3 disposed on the upper face 2*a* of the sealing resin 2. Thus, the reflective layer 3 is disposed on the upper face 2*a* of the sealing resin 2 that is provided so as to cover the LED chips 100*a*. Thus, the surface area (plane area) of the reflective layer 3 can be easily made larger than the surface area (plane area) of the LED chips 100*a*. As a result, compared to when the surface area (plane area) of the reflective layer 3 is substantially equal to the surface area (plane area) of the LED chips 100*a*, a greater proportion of the light emitted from the LED chips 100*a* to the upper side of the LED chip 100*a* is reflected by the reflective layer 3 toward the sides of the LED chips 100*a*. Consequently, the proportion of the light emitted to the sides of the LED element 100 can be increased with respect to the light emitted to the upper side of the LED element 100. Thus, the decrease in the distribution angle of the light from the LED element 100 can be suppressed. Also, by providing the reflective layer 3 and the LED chip 100*a* separately, there is no need to take into account the influence of heat generation or the like in the LED chip 100*a*. Thus, the material of the reflective layer 3 can be selected from a wider range. Also, by providing the reflective layer 3 on the sealing resin 2, the reflective layer 3 can be formed more easily than when the reflective layer 3 and the LED chip 100*a* are provided integrally. Note that the phrase "the upper face 2*a* is formed substantially flat" is a broad concept encompassing a case in which fine bumps or pits are formed on the upper face 2*a* of the sealing resin 2.

In the first embodiment, as described above, the display device 10 is configured such that the outer periphery of the reflective layer 3 is disposed more to the outside than the outer periphery of the LED chip 100*a* in the plan view. Consequently, in the plan view, the region occupied by the reflective layer 3 covers the entire region occupied by the LED chip 100*a*, and the surface area of the reflective layer 3 is larger than the surface area of the LED chip 100*a*. As a result, the light emitted from the LED chip 100*a* to the upper side of the LED chip 100*a* can be easily reflected by the reflective layer 3 to all four sides of the LED chip 100*a*. Consequently, the proportion of the light emitted to the sides of the LED element 100 can be further increased with respect to the light emitted to the upper side of the LED element 100. Thus, the decrease in the distribution angle of the light from the LED element 100 can be further suppressed.

In the first embodiment, as described above, the display device 10 is configured such that the reflective layer 3 has the outer periphery that substantially overlaps the outer periphery of the sealing resin 2 in the plan view. Consequently, the light passing near the edges of the sealing resin 2 can be reflected by the reflective layer 3. Thus, the light from the LED chip 100*a* can be easily reflected to the sides of the LED element 100.

Also, in the first embodiment, as described above, the display device 10 is configured such that the sapphire substrate 1 of the LED chip 100*a* is disposed on the uppermost surface (at the top of the LED chip 100*a*), and the upper face 1*a* of the sapphire substrate 1 and the lower face 3*a* of the reflective layer 3 are separated from each other by the sealing resin 2. Consequently, there is no need to adjust the height of the sealing resin 2 so that the reflective layer 3 will straddle both the upper face 1*a* of the sapphire substrate 1 and the upper face 2*a* of the sealing resin 2 to the side of the sapphire substrate 1. Thus, the LED element 100 can be formed more easily. Also, the sapphire substrate 1 and the reflective layer 3 do not interfere with each other. Thus, degradation of the sapphire substrate 1 and the reflective layer 3 can be suppressed.

In the first embodiment, as described above, the display device 10 is configured such that the LED element 100 further includes the phosphor layer 9 that is disposed between the sealing resin 2 and the LED chip 100*a*. The phosphor layer 9 is disposed on the side faces of the LED chip 100*a*, and is disposed so as to overlap the reflective layer 3 in the plan view. The sealing resin 2 and the upper face 1*a* of the LED chip 100*a* (the sapphire substrate 1) closely contact with each other. Consequently, the phosphor layer 9 is not disposed on the upper face 1*a* of the LED chip 100*a* (the sapphire substrate 1), and the phosphor layer 9 is disposed only on the side faces of the LED chip 100*a*. Thus, the height of the LED element 100 can be reduced.

In the first embodiment, as described above, the display device 10 is configured such that the phosphor layer 9 is arranged to surround the side faces of the LED chip 100*a*. Consequently, the light traveling from the side faces of the LED chip 100*a* can easily be introduced into the phosphor layer 9.

In the first embodiment, as described above, the display device 10 is configured such that the lower face 3*a* of the reflective layer 3 has an uneven shape. Consequently, the light emitted from the LED chip 100*a* and incident on the lower face 3*a* of the reflective layer 3 is diffused by the convex and the concave (or the texturing) on the reflective layer 3. Thus, the proportion of the light reflected to the sides of the LED chip 100*a* can be effectively increased.

In the first embodiment, as described above, the display device 10 is configured such that the upper face 1*a* of the sapphire substrate 1 has an uneven shape. Consequently, the light emitted from the LED chip 100*a* is diffused by the convex and concave (or texturing) on the sapphire substrate 1. Thus, the proportion of the light emitted to the sides of the LED element 100 can be effectively increased.

In the first embodiment, as described above, the display device 10 is configured such that the reflective layer 3 includes gold. Gold has excellent resistance to heat and humidity (heat resistance and corrosion resistance). Therefore, if the reflective layer 3 includes gold, the resistance of the reflective layer 3 to heat and humidity (heat resistance and corrosion resistance) can be improved.

In the first embodiment, as described above, the display device 10 is configured such that the reflective layer 3 is formed substantially flat shape. This allows the reflective layer 3 to be formed more easily.

In the first embodiment, as described above, the display device 10 is configured such that the substrate includes the sapphire substrate 1, and the LED chip 100*a* includes the sapphire substrate 1, the N-type GaN layer 4, the PN junction 5, and the P-type GaN layer 6 that are disposed in this order starting from the upper face 2*a* side of the sealing resin 2. The sapphire substrate 1 here has excellent translucency. Therefore, if the substrate includes the sapphire substrate 1, the proportion of light absorbed by the substrate can be decreased. Thus, the decrease in the emission efficiency of the LED element 100 can be suppressed.

In the first embodiment, as described above, the display device 10 is configured to include the LED chips 100*a* that are disposed on the rear face side of the display device main body 10*a*. The LED chips 100*a* are covered by the sealing resin 2. The reflective layer 3 is disposed on the upper face 2*a* of the sealing resin 2. The light emitted from the LED chips 100a is reflected by the reflective layer 3. The reflective layer 3 is disposed on the upper face 2a of the sealing resin 2 that is provided to cover the LED chips 100a. Thus, the surface area (plane area) of the reflective layer 3 can be easily made larger than the surface area (plane area) of the LED chips 100a. As a result, the greater proportion of the light emitted from the LED chips 100a toward the upper side of the LED chips 100a is reflected to the sides of the LED chips 100a by the reflective layer 3 as compared to when the surface area (plane area) of the reflective layer 3 is substantially equal to the surface area (plane area) of the LED chips 100a. Consequently, the proportion of the light emitted to the sides of the LED element 100 can be increased with respect to the light emitted to the upper side of the LED element 100. Thus, the decrease in the distribution angle of light from the LED element 100 can be suppressed. As a result, it is possible to widen the irradiation range of light emitted by the LED element 100. Therefore, the occurrence of uneven brightness in the display component 11 of the display device main body 10a can be suppressed.

In the first embodiment, as described above, the display device 10 is configured such that the LED element 100 is disposed at a location closer to the display component 11 than the bottom face 12a in a direction substantially perpendicular to the display face 11e of the display component 11. Consequently, compared to when the LED element 100 is disposed on the bottom face 12a, the distance between the LED element 100 and the display component 11 can become shorter. Thus, the light from the LED element 100 can be transmitted more efficiently to the display component 11.

Second Embodiment

Next, the configuration of a display device 20 pertaining to a second embodiment will now be described through reference to FIGS. 5 and 6. The display device 10 in the first embodiment includes the LED element 100 in which the sapphire substrate 1 and the reflective layer 3 are separated. On the other hand, the display device 20 in the second embodiment differs from the display device 10 in the first embodiment in that the display device 20 includes an LED element 200 in which the sapphire substrate 1 and the reflective layer 3 closely contact with each other. Those components that have the same configuration as in the first embodiment above are labeled the same in the drawings. The LED element 200 is an example of the "at least one light source" of the present disclosure.

Figure 5:
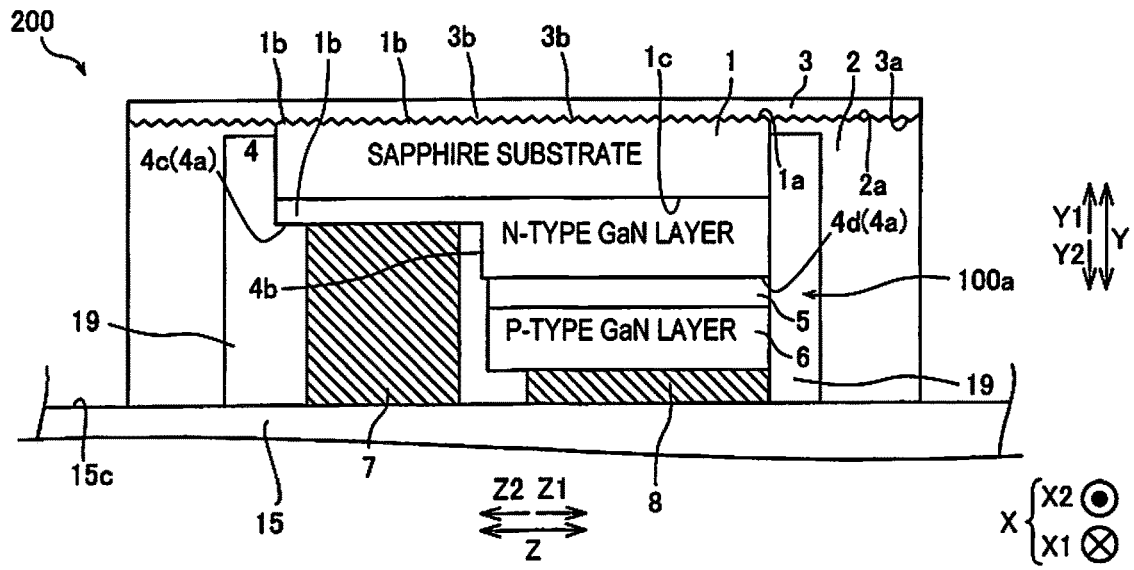
FIG. 5 is a cross sectional view of a light source of the display device pertaining to the second embodiment.

In the second embodiment, as shown in FIG. 5, the configuration is such that the upper face 1a of the sapphire substrate 1 and the lower face 3a of the reflective layer 3 closely or directly contact with each other. More specifically, the sealing resin 2 is not interposed between the upper face 1a of the sapphire substrate 1 and the lower face 3a of the reflective layer 3.

Figure 6:
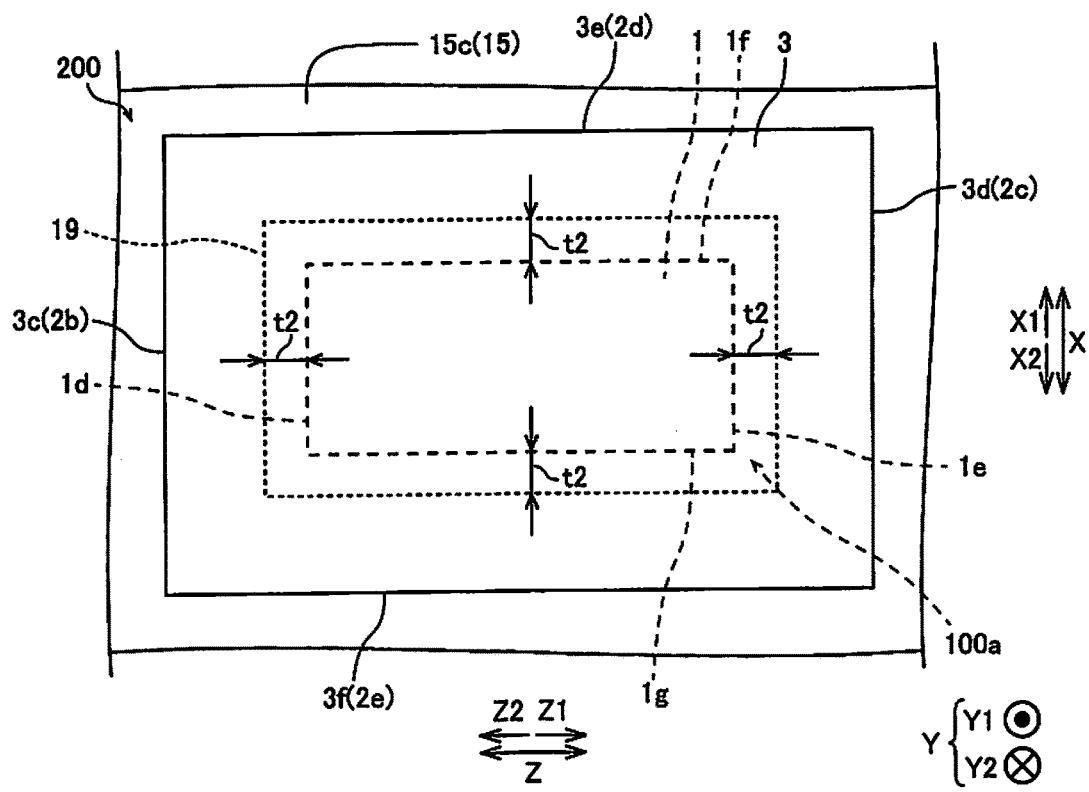
FIG. 6 is a top plan view of the light source pertaining to the second embodiment.

As shown in FIG. 6, in the plan view, a phosphor layer 19 with a thickness t2 is disposed so as to closely contact with the short side 1d, the short side 1e, the long side 1f, and the long side 1g of the LED chip 100a (the sapphire substrate 1). The thickness t2 is less than the thickness t1 (see FIG. 4).

The rest of the configuration of the second embodiment is the same as in the first embodiment.

Effect of Second Embodiment

In the second embodiment, as described above, the display device 20 is configured such that the LED chip 100a includes the sapphire substrate 1 that is disposed on the uppermost face (or at the top of the LED chip 100d), and the upper face 1a of the sapphire substrate 1 and the lower face 3a of the reflective layer 3 closely contact with each other. Consequently, the sealing resin 2 is not interposed between the upper face 1a of the sapphire substrate 1 and the lower face 3a of the reflective layer 3. Thus, the light emitted from the LED chip 100a to the upper side is less likely to be absorbed by the sealing resin 2. As a result, the decrease in the emission efficiency of the LED element 200 can be suppressed.

The other effects of the second embodiment are the same as in the first embodiment.

Third Embodiment

The configuration of a display device 30 pertaining to a third embodiment will now be described through reference to FIGS. 1 to 7. With the display device 10 in the first embodiment, the phosphor layer 9 is provided to the LED element 100. On the other hand, with the display device 30 in this third embodiment, a LED element 300 is not provided with the phosphor layer 9. Those components that have the same configuration as in the first embodiment above are labeled the same in the drawings. The LED element 300 is an example of the "at least one light source" of the present disclosure.

Figure 7:
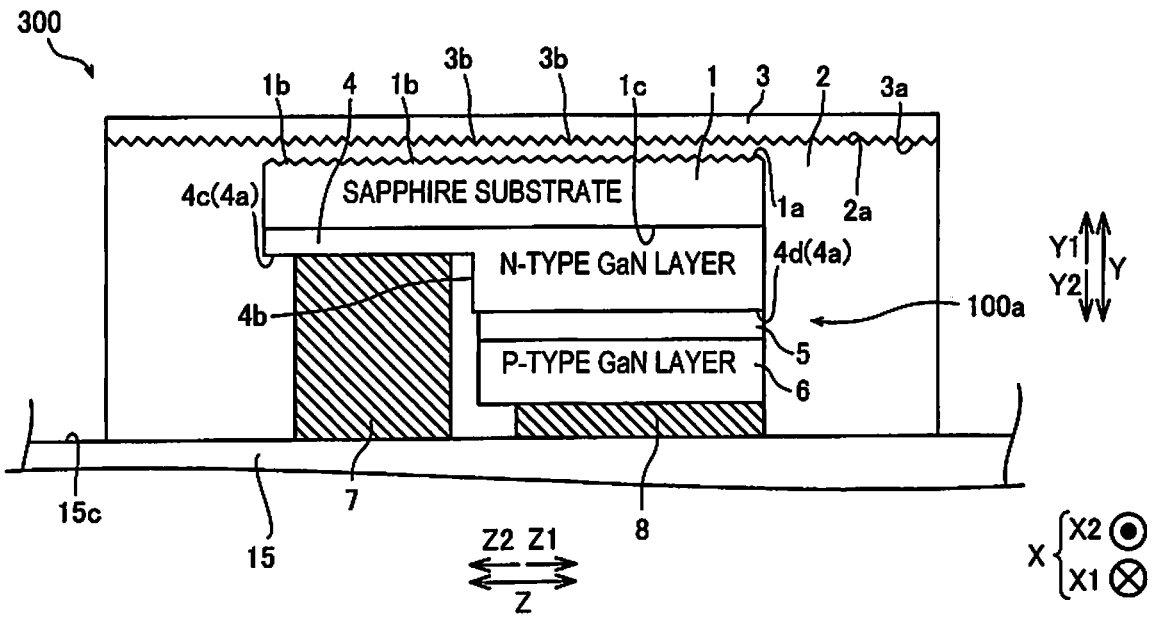
FIG. 7 is a cross sectional view of a light source of the display device pertaining to the third embodiment.

In the third embodiment, as shown in FIG. 7, the side faces of the LED chip 100a and the sealing resin 2 closely or directly contact with each other. More specifically, the phosphor layer 9 is not interposed between the side faces of LED chip 100 and the sealing resin 2. More precisely, in the illustrated embodiment, the display device 30 includes an optical sheet 23 (see FIG. 1) with quantum dots. With this configuration, the color of the light emitted from the LED chips 100a changes when the light is incident on the optical sheet 23.

The rest of the configuration of the third embodiment is the same as in the first embodiment above.

Effect of Third Embodiment

The following effect can be obtained with the third embodiment.

In the third embodiment, as described above, the display device 30 is configured such that the side faces of the LED chip 100 and the sealing resin 2 closely contact with each other. Consequently, unlike when the phosphor layer 9 or the like is provided to the side faces of the LED chip 100a, the LED element 300 can be made smaller.

The other effects of the third embodiment are the same as in the first embodiment above.

Fourth Embodiment

The configuration of a display device 40 pertaining to a fourth embodiment will now be described through reference to FIGS. 8 and 9. With the display device 40 in this fourth embodiment, unlike in the first embodiment, a pattern is formed on a reflective layer 33 of an LED element 400. Those components that have the same configuration as in the first embodiment above are labeled the same in the drawings. The LED element 400 is an example of the "at least one light source" of the present disclosure.

Figure 8:
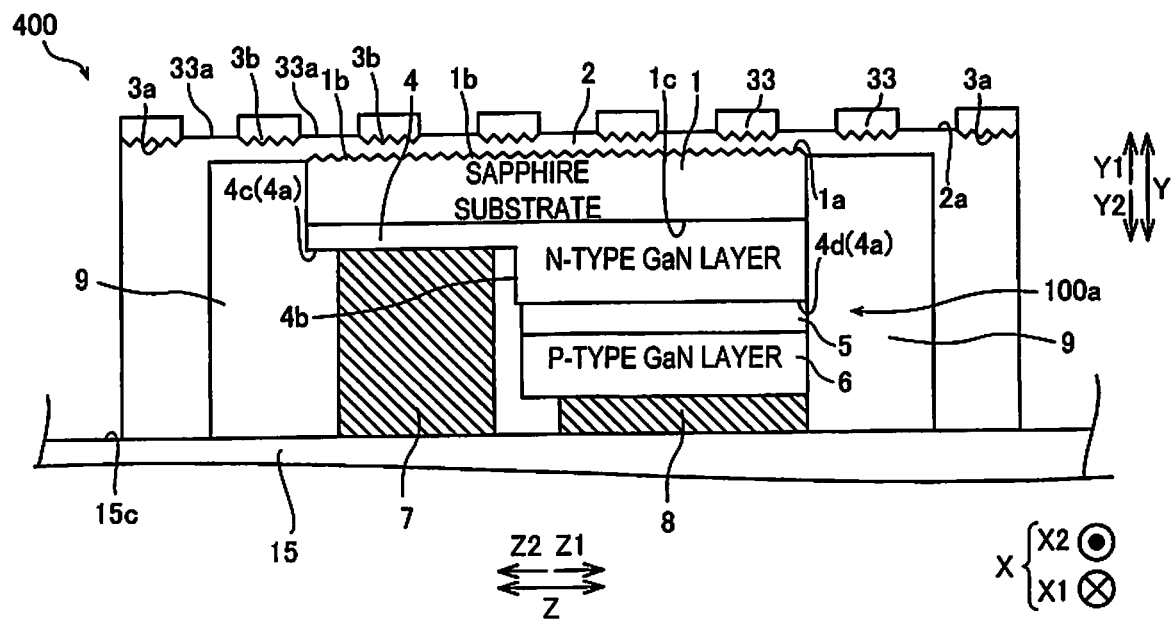
FIG. 8 is a cross sectional view of a light source of the display device pertaining to a fourth embodiment.

In the fourth embodiment, as shown in FIG. 8, the reflective layer 33 includes a specific pattern that transmits part of the light from the LED chips 100a. More specifically, grooves 33a are formed by removing part of the reflective layer 33, and the sealing resin 2 is exposed outside from the grooves 33a. Thus, the upper face 2a of the sealing resin 2 exposes outside through gaps (grooves 33a) in the reflective layer 33.

Figure 9:
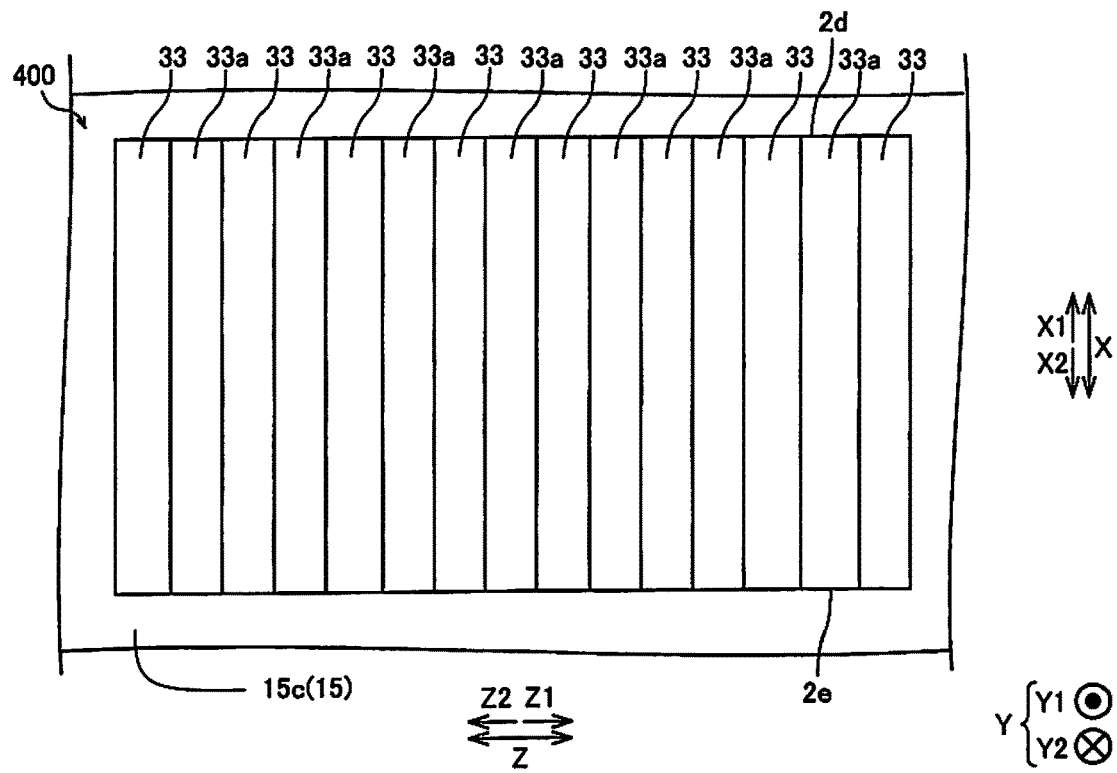
FIG. 9 is a top plan view of the light source pertaining to the fourth embodiment.

In the fourth embodiment, as shown in FIG. 9, the specific pattern has a shape in which rectangles are arranged in the Z direction. More specifically, in the plan view, the grooves 33a extend in the X direction from the long side 2d of the sealing resin 2 to the long side 2e. More precisely, the configuration is such that in the plan view the reflective layer 33 and the grooves 33a arranged in a continuously alternating pattern. The Z direction is an example of the "specific direction" of the present disclosure.

The rest of the configuration of the fourth embodiment is the same as in the first embodiment above.

Effect of Fourth Embodiment

The following effect can be obtained with the fourth embodiment.

With the fourth embodiment, as described above, the display device 40 is configured such that the reflective layer 33 includes a specific pattern that transmits part of the light from the LED chips 100a. Consequently, part of the light from the LED chips 100a can be utilized by being transmitted to the outside of the LED element 400 through the pattern of the reflective layer 33 (the gaps in the pattern).

With the fourth embodiment, as described above, the display device 40 is configured such that a specific pattern has a shape in which rectangles are arranged in the Z direction. Consequently, part of the light from the LED chips 100a can be easily transmitted to the outside of the LED element 400.

The other effects of the fourth embodiment are the same as in the first embodiment above.

Modification Example

The embodiments disclosed herein are just examples in every respect, and should not be interpreted as being limiting in nature. The scope of the invention being indicated by the appended claims rather than by the above description of the embodiments, all modifications (modification examples) within the meaning and range of equivalency of the claims are included.

Figure 10:
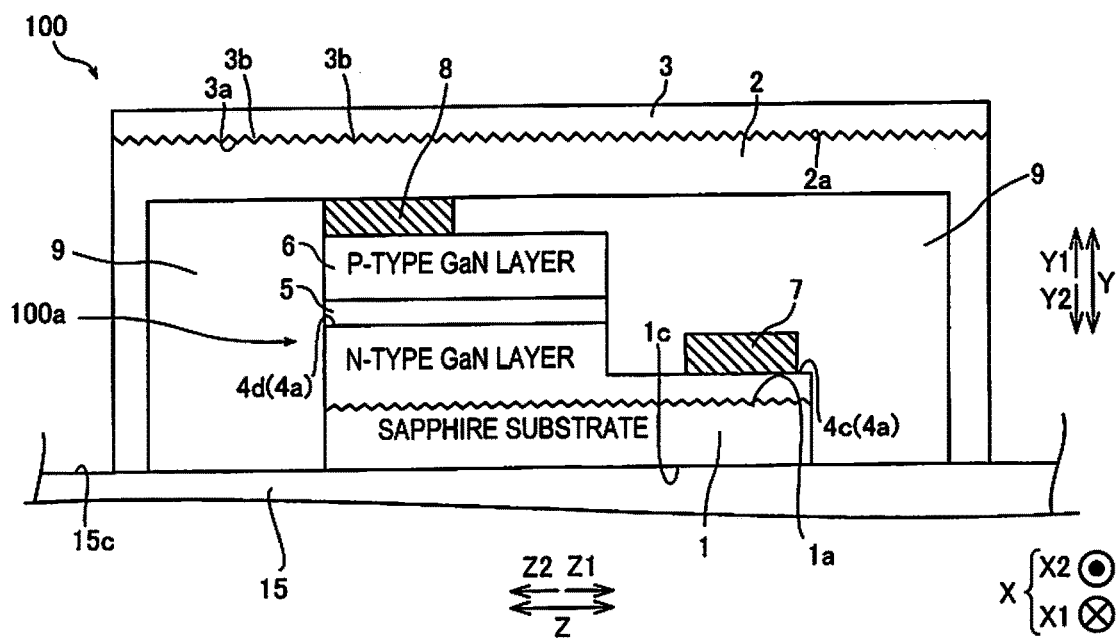
FIG. 10 is a cross sectional view of a light source of the display device pertaining to a modification example of the first embodiment.

For example, in the first embodiment, the LED chips 100a are a flip-chip type in which the sapphire substrate 1 is disposed on the uppermost surface (at the top of the LED element 100). However, the present invention is not limited to or by this. For example, as shown in FIG. 10, the LED chip 100a can be a lateral chip type in which the sapphire substrate 1 is disposed on the lowermost surface (at the bottom of the LED element 100). In this case, the negative electrode pad 7 and the positive electrode pad 8 are connected by wires (not shown) to the copper foil (not shown) on the flat part 15c of the light source disposition component 15. The LED chips 100a in the second to fourth embodiments can also be a lateral chip type.

Also, in the first to fourth embodiments above, the light source includes the LED element 100 (200, 300, 400). However, the present invention is not limited to or by this. For example, the light source can be an element other than an LED element.

Also, in the fourth embodiment, the reflective layer 33 has a shape in which rectangles are arranged in the Z direction. However, the present invention is not limited to or by this. For example, the reflective layer 33 can have a lattice shape.

Specifically, in this case, the reflective layer 33 can include crisscrossing strips arranged horizontally and vertically, or a sheet-like member with apertures spaced part with each other.

Also, in the first and fourth embodiments, the phosphor layer 9 is disposed only on the side faces of the LED chips 100a. However, the present invention is not limited to or by this. For example, the phosphor layer 9 can also be provided on the upper faces 1a of the LED chips 100a (the sapphire substrate 1).

Also, in the first to fourth embodiments, the upper face 1a of the sapphire substrate 1 has an uneven shape. However, the invention is not limited to or by this. For example, the lower face 1c of the sapphire substrate 1 can have an uneven shape. Also, each of the upper face 1a and the lower face 1c of the sapphire substrate 1 can have an uneven shape.

Also, in the first to fourth embodiments, the reflective layer 3 (33) is formed from gold. However, the present invention is not limited to or by this. For example, the reflective layer 3 (33) can be formed from silver.

Also, in the first to fourth embodiments, in the plan view, the reflective layer 3 (33) (the LED element 100 (200, 300, 400)) and the sapphire substrate 1 (the LED chips 100a) are each rectangular in shape. However, the present invention is not limited to or by this. For example, the reflective layer 3 (33) (the LED element 100 (200, 300, 400)) and the sapphire substrate 1 (the LED chips 100a) can each have a square shape.

Also, in the first to fourth embodiments, the protrusions 1b (protrusions 3b) protrudes so as to taper toward the arrow Y1 (Y2) direction side. However, the present invention is not limited to or by this. For example, the protrusions 1b (protrusions 3b) can have a spherical surface.

Figure 11:
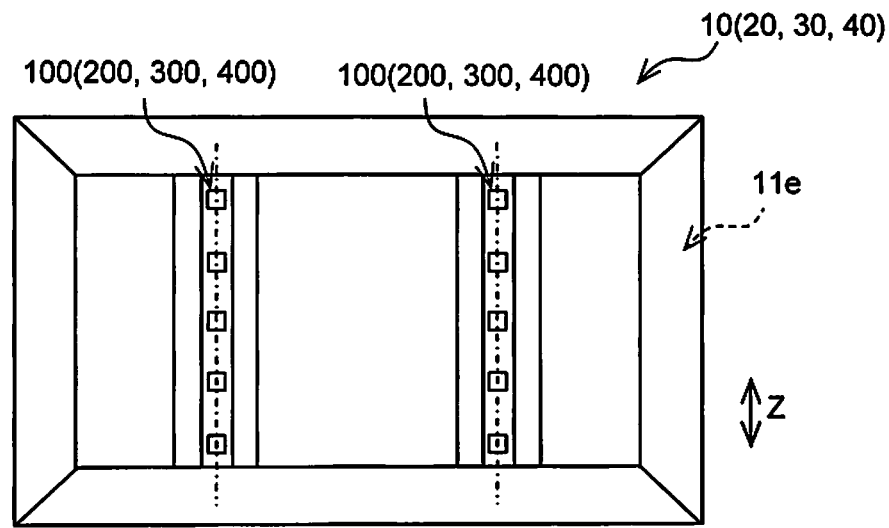
FIG. 11 is an elevational view of the display device pertaining to a modification example, illustrating an arrangement of the light sources.
Figure 12:
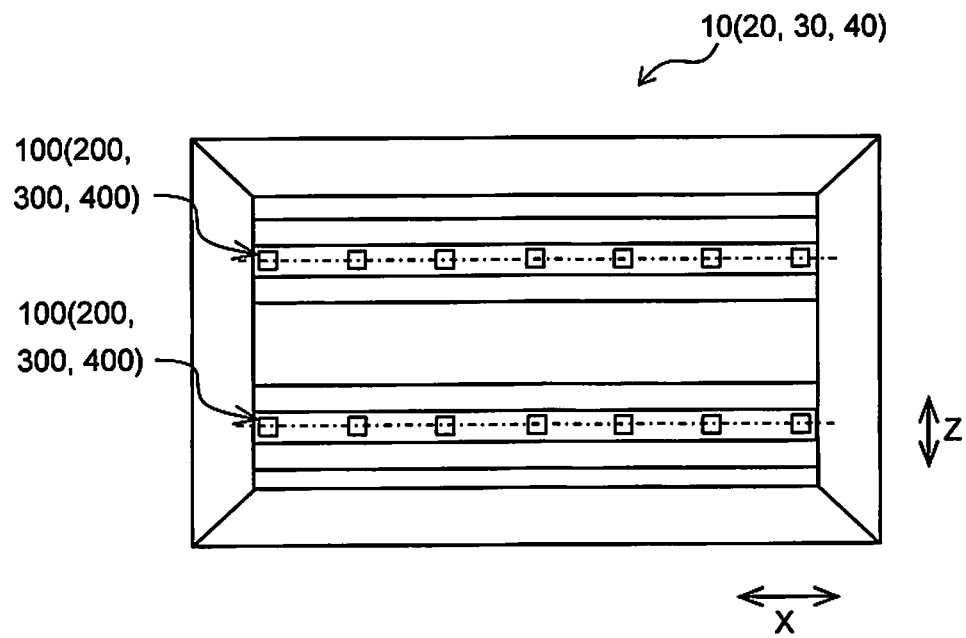
FIG. 12 is an elevational view of the display device pertaining to a modification example, illustrating another arrangement of the light sources.

As shown in FIG. 1, the display device 10 (20, 30, 40) includes the plurality of the LED elements 100 (200, 300, 400). The LED elements 100 (200, 300, 400) are arranged along a horizontal line (along the X direction) on a plane substantially parallel to the display face 11e of the display component 11 (XZ plane). However, as shown in FIG. 11, the LED elements 100 (200, 300, 400) can be arranged along a vertical line (along the Z direction) on a plane substantially parallel to the display face 11e of the display component 11 (XZ plane). Also, as shown in FIG. 12, the LED elements 100 (200, 300, 400) can be arranged in a plurality of lines.

[1] In view of the state of the known technology and in accordance with an aspect of the present invention, a display device comprises a display (or a display component) and at least one light source. The display is configured to display image. The at least one light source is configured to emit light to the display. The at least one light source includes a semiconductor element with a substrate, a translucent sealing resin that covers the semiconductor element, and a reflective layer that is disposed on an upper face of the sealing resin.

With this display device, as described above, the reflective layer is disposed on the upper face of the sealing resin, which is provided to cover the semiconductor element. Thus, the surface area (plane area) of the reflective layer can be easily made larger than the surface area (plane area) of the semiconductor element. As a result, compared to when the surface area (plane area) of the reflective layer is substantially equal to the surface area (plane area) of the semiconductor element, a greater proportion of the light emitted from the semiconductor element toward the upper side of the semiconductor element is reflected to the sides of the semiconductor element by the reflective layer. This makes it possible to increase the proportion of the light emitted to the sides of the at least one light source with respect to the light emitted toward the upper side of the at least one light source. Thus, the decrease in the distribution angle of the light from the at least one light source can be suppressed. Also, by providing the reflective layer and the semiconductor element separately, there is no need to take into account the influence of heat generation from the semiconductor element and other such factors. Thus, the material of the reflective layer can be selected from a wide variety of materials. Also, by providing the reflective layer on the sealing resin, the reflective layer can be formed more easily than when the reflective layer and the semiconductor element are provided integrally.

[2] In accordance with a preferred embodiment according to the display device mentioned above, the reflective layer has an outer periphery that is disposed further outside than an outer periphery of the semiconductor element as viewed in a direction perpendicular to an upper face of the at least one light source. With this configuration, in a plan view (or as viewed in the direction perpendicular to the upper face of the at least one light source), the region occupied by the reflective layer covers the entire region occupied by the semiconductor element, and the surface area of the reflective layer is larger than the surface area of the semiconductor element. As a result, the light emitted from the semiconductor element toward the upper side of the semiconductor element can be easily reflected to all four sides of the semiconductor element by the reflective layer. This makes it possible to further increase the proportion of the light emitted to the sides of the at least one light source with respect to the light emitted toward the upper side of the at least one light source. Thus, the decrease in the distribution angle of the light from the at least one light source can be further suppressed.

[3] In accordance with a preferred embodiment according to any one of the display devices mentioned above, the substrate is disposed at a top of the semiconductor element, and an upper face of the substrate and a lower face of the reflective layer are separated by the sealing resin. With this configuration, there is no need to form the reflective layer such that the reflective layer straddles both the upper face of the sealing resin and the upper face of the substrate. Also, there is no need to adjust the height of the upper face of the sealing resin to match with the height of the upper face of the substrate. Thus, the at least one light source can be formed more easily. Also, the substrate and the reflective layer do not interfere with each other. Thus, deterioration of the substrate and the reflective layer can be suppressed.

[4] In accordance with a preferred embodiment according to any one of the display devices mentioned above, the reflective layer includes a specific pattern that transmits part of the light from the semiconductor element. With this configuration, part of the light from the semiconductor element can be utilized by transmitting the light to the outside of the at least one light source through the pattern of the reflection layer (the gaps in the pattern).

[5] In accordance with a preferred embodiment according to any one of the display devices mentioned above, the specific pattern has a lattice-shape or has a shape in which rectangles are arranged in a specific direction. With this configuration, part of the light from the semiconductor element can be easily transmitted to the outside of the at least one light source.

[6] In accordance with a preferred embodiment according to any one of the display devices mentioned above, the at least one light source further includes a phosphor layer that is disposed between the sealing resin and the semiconductor element. The phosphor layer is disposed on side faces of the semiconductor element, and overlaps the reflective layer in a plan view (as viewed in a direction perpendicular to an upper face of the at least one light source). The sealing resin and an upper face of the semiconductor element closely contact with each other. With this configuration, the phosphor layer is not disposed on the upper face of the semiconductor element, and is disposed only on the side faces of the semiconductor element. Thus, the height of the at least one light source can be reduced.

[7] In accordance with a preferred embodiment according to any one of the display devices mentioned above, the phosphor layer is arranged to surround the side faces of the semiconductor element. With this configuration, light traveling from the side faces of the semiconductor element can be easily guided into the phosphor layer.

[8] In accordance with a preferred embodiment according to any one of the display devices mentioned above, the sealing resin and side faces of the semiconductor element closely contact with each other. With this configuration, unlike the case when a phosphor layer or the like is provided on the side faces of the semiconductor element, etc., the at least one light source can be made smaller.

[9] In accordance with a preferred embodiment according to any one of the display devices mentioned above, the reflective layer is formed substantially flat. With this configuration, the reflective layer can be easily formed.

[10] In accordance with a preferred embodiment according to any one of the display devices mentioned above, the substrate is made of a sapphire substrate. The semiconductor element includes the sapphire substrate, a first conductivity type GaN layer, a light emitting layer, and a second conductivity type GaN layer that are arranged in this order from an upper face side of the sealing resin. Here, a sapphire substrate has excellent light transmittance. Therefore, if the substrate is made of a sapphire substrate, the proportion of light absorbed by the substrate can be reduced. Thus, the decrease in emission efficiency of the at least one light source can be suppressed.

[11] In accordance with a preferred embodiment according to any one of the display devices mentioned above, the display device further comprises a reflective sheet configured to reflect light from the at least one light source. The reflective sheet includes a bottom face that is arranged substantially parallel to a display face of the display. The at least one light source is disposed at a location closer to the display than the bottom face in a direction substantially perpendicular to the display face of the display. With this configuration, the distance between the at least one light source and the display is shorter than when the at least one light source is disposed on the bottom face. Thus, the light from the at least one light source can be transmitted more efficiently to the display.

[12] In accordance with a preferred embodiment according to any one of the display devices mentioned above, the at least one light source includes a plurality of light sources.

[13] In accordance with a preferred embodiment according to any one of the display devices mentioned above, the light sources are arranged along a horizontal line on a plane substantially parallel to a display face of the display.

[14] In accordance with a preferred embodiment according to any one of the display devices mentioned above, the light sources are arranged along a vertical line on a plane substantially parallel to a display face of the display.

[15] In accordance with a preferred embodiment according to any one of the display devices mentioned above, the light sources are arranged in a plurality of lines.

[16] In accordance with a preferred embodiment according to any one of the display devices mentioned above, the reflective layer has an outer periphery that substantially overlaps with an outer periphery of the sealing resin as viewed in a direction perpendicular to an upper face of the at least one light source.

[17] In accordance with a preferred embodiment according to any one of the display devices mentioned above, the reflective layer has an upper face that forms an uppermost face of the at least one light source.

[18] In accordance with a preferred embodiment according to any one of the display devices mentioned above, the substrate has an uneven upper face.

[19] In accordance with a preferred embodiment according to any one of the display devices mentioned above, the sealing resin entirely covers the semiconductor element and the phosphor layer.

[20] In accordance with a preferred embodiment according to any one of the display devices mentioned above, the upper face of the sealing resin exposes outside through a gap in the reflective layer.

With the present invention, as described above, it is possible to provide a display device capable of suppressing the decrease in the light distribution angle.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a display device in an upright position. Accordingly, these directional terms, as utilized to describe the display device should be interpreted relative to a display device in an upright position on a horizontal surface. The terms "left" and "right" are used to indicate the "right" when referencing from the right side as viewed from the front of the display device, and the "left" when referencing from the left side as viewed from the front of the display device.

The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A display device comprising:
    a display that displays image;
    at least one light source array each having a plurality of light sources that is linearly arranged with respect to each other in a first direction of the display device and emits light to the display; and
    at least one light source disposition component on each of which only one light source array is disposed, with the at least one light source disposition component having a trapezoidal cross-sectional shape taken in a plane perpendicular to the first direction of the display device, with the trapezoidal cross-sectional shape having two non-parallel opposite sides.

2. The display device according to claim 1, wherein the at least one light source disposition component each has a pair of inclined parts and a flat part that connects the inclined parts.

3. The display device according to claim 2, wherein the light source array is disposed on the flat part of the corresponding light source disposition component.

4. The display device according to claim 2, further comprising
    a wiring board for the light source array, the wiring board being provided between the light source array and the flat part of the corresponding light source disposition component.

5. The display device according to claim 2, further comprising
    a heat sink provided between the light source array and the flat part of the corresponding light source disposition component.

6. The display device according to claim 1, further comprising
    a reflective sheet that reflects the light from the light sources.

7. The display device according to claim 6, wherein the at least one light source disposition component is covered by the reflective sheet.

8. The display device according to claim 6, wherein the reflective sheet has at least one pair of inclined parts, the inclined parts of the reflective sheet being provided to be opposite a pair of inclined parts of the corresponding light source disposition component, respectively.

9. The display device according to claim 6, wherein the reflective sheet includes a bottom face that is arranged substantially parallel to a display face of the display.

10. The display device according to claim 9, wherein the at least one light source array is disposed at a location closer to the display than the bottom face of the reflective sheet in a direction substantially perpendicular to the display face of the display.

11. The display device according to claim 1, wherein the light sources are LED elements.

12. The display device according to claim 1, wherein the light sources are arranged along a horizontal line on a plane substantially parallel to a display face of the display.

13. The display device according to claim 1, wherein the light sources are arranged along a vertical line on a plane substantially parallel to a display face of the display.

14. The display device according to claim 1, wherein the at least one light source array includes a plurality of light source arrays arranged in a plurality of lines.

\* \* \* \* \*